United States Patent
Ho et al.

(10) Patent No.: US 7,030,024 B2
(45) Date of Patent: Apr. 18, 2006

(54) DUAL-GATE STRUCTURE AND METHOD OF FABRICATING INTEGRATED CIRCUITS HAVING DUAL-GATE STRUCTURES

(75) Inventors: Tuo-Hung Ho, Chia-Yi (TW);
Ming-Fang Wang, Taichung (TW);
Chi-Chun Chen, Kaohsiung (TW);
Chih-Wei Yang, Kaohsiung (TW);
Liang-Gi Yao, Hsing-Chu (TW);
Chih-Chang Chen, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 290 days.

(21) Appl. No.: 10/226,617

(22) Filed: Aug. 23, 2002

(65) Prior Publication Data

US 2004/0038538 A1    Feb. 26, 2004

(51) Int. Cl.
*H01L 21/302* (2006.01)

(52) U.S. Cl. ............... 438/702; 438/704; 438/745; 438/751

(58) Field of Classification Search ............... 438/694, 438/699, 702, 704, 745, 751
See application file for complete search history.

(56) References Cited

U.S. PATENT DOCUMENTS

| | | | |
|---|---|---|---|
| 6,030,862 A | 2/2000 | Kepler | |
| 6,063,670 A | 5/2000 | Lin et al. | |
| 6,210,999 B1 | 4/2001 | Gardner et al. | |
| 6,261,978 B1 | 7/2001 | Chen et al. | |
| 6,262,456 B1 | 7/2001 | Yu et al. | |
| 6,268,251 B1 | 7/2001 | Zhong et al. | |
| 6,297,103 B1 | 10/2001 | Ahn et al. | |
| 6,320,238 B1 | 11/2001 | Kizilyalli et al. | |
| 6,368,923 B1 | 4/2002 | Huang | |
| 6,383,871 B1 | 5/2002 | Noble et al. | |
| 6,475,911 B1 * | 11/2002 | Lane | 438/686 |
| 6,518,106 B1 * | 2/2003 | Ngai et al. | 438/157 |
| 6,524,908 B1 * | 2/2003 | Cabral et al. | 438/254 |
| 6,656,852 B1 * | 12/2003 | Rotondaro et al. | 438/749 |
| 6,660,578 B1 * | 12/2003 | Karlsson et al. | 438/199 |

FOREIGN PATENT DOCUMENTS

KR    1020010038795    5/2001

OTHER PUBLICATIONS

Semiconductor Glossary, http://www.semiconductorglossary.com/default.asp?searchterm=high-k+dielectric.*
Chambers, J.J. et al., Texas Instruments Inc. Silicon Research, Dallas, TX, "Effect of Composition and Post-Deposition Annealing on the Etch Rate of Hafnium and Zirconium Silicates in Dilute HF," 2001$^{st}$ Meeting of the Electrochemical Society, Sep. 2001.

* cited by examiner

*Primary Examiner*—Nadine G. Norton
*Assistant Examiner*—Binh X. Tran
(74) *Attorney, Agent, or Firm*—Duane Morris LLP

(57) ABSTRACT

A method of fabricating a dual-gate on a substrate and an integrated circuit having a dual-gate structure are provided. A first high-K dielectric layer is formed in a first area defined for a first gate structure and in a second area defined for a second gate structure. A second high-K dielectric layer is formed in the first and second areas. The first high-K dielectric layer has a lower etch rate to an etchant relative to the second high-K dielectric layer. The second high-K dielectric layer is etched from the second area to said first high-K dielectric layer with the etchant, and a gate conductive layer is formed in the first and second areas over the second high-K dielectric layer and first high-K dielectric layer, respectively.

35 Claims, 2 Drawing Sheets

DUAL-GATE STRUCTURE AND METHOD OF FABRICATING INTEGRATED CIRCUITS HAVING DUAL-GATE STRUCTURES

FIELD OF THE INVENTION

The present invention relates to methods of forming semiconductor devices and to device structures formed thereby, and more particularly to methods for forming dual-gate semiconductor device structures and to dual-gate semiconductor structures formed thereby.

DESCRIPTION OF THE RELATED ART

Integrated circuits that include devices having different gate dielectric thicknesses (hereinafter sometimes referred to as dual-gate structures) are becoming more common as devices operating at different voltage potentials are incorporated into the same integrated circuit designs. For example, operating voltages of input and output transistors in the same circuit design may differ. Generally, high-speed, lower voltage devices utilize thinner gate dielectrics than high voltage devices. The gate dielectric, such as a gate oxide, of lower operating voltage devices, however, cannot withstand the higher voltage of the older technology, higher operating voltage devices. One solution to this problem is to form transistors having thicker gate dielectrics on the same substrate as the low voltage transistors. Fabricating such devices, however, gives rise to manufacturing complexities and challenges, such as the introduction of additional cleaning, growth and/or deposition steps.

One method for forming an integrated circuit device having a dual-gate structure is provided in U.S. Pat. No. 6,261,978 to Chen et al., entitled "Process for Forming Semiconductor Device with Thick and Thin Films" issued Jul. 17, 2001. Chen describes a fabrication process where a first gate oxide layer is grown over a substrate. A resist layer is then patterned to expose portions of the first oxide layer, and portions of the first oxide layer are removed to expose portions of the semiconductor substrate. Subsequently, the resist layer is removed, and the substrate is then cleaned with a solution that does not include fluorine. A second oxide layer is then grown over the cleaned, exposed substrate and the remaining first oxide layer to form two gate dielectric layers having different thicknesses.

While Chen provides one method of fabricating integrated circuit devices having dual-gate dielectrics, there remains a need for a more efficient fabrication process for forming dual-gate dielectric structures that eliminates, for example, the need for additional substrate cleaning steps. Further, as device dimensions continue to decrease, giving rise to leakage current and additional processing difficulties, there remains a need to better utilize high-K dielectric materials in integrated circuit designs utilizing dual-gate dielectric structures, while insuring high film quality for such dielectric structures.

SUMMARY OF THE INVENTION

A method of fabricating a dual-gate on a substrate is provided. A first high-K dielectric layer is formed in a first area defined for a first gate structure and in a second area defined for a second gate structure. A second high-K dielectric layer is formed in the first and second areas. The first high-K dielectric layer has a lower etch rate to an etchant relative to said second high-K dielectric layer. The second high-K dielectric layer is etched from the second area to the first high-K dielectric layer with the etchant, and a gate conductive layer is formed in the first and second areas over the second high-K dielectric layer and first high-K dielectric layer, respectively.

An integrated circuit having a dual-gate structure is also provided including a first device having a gate structure including a gate dielectric including a first high-K dielectric layer formed over a substrate and a second high-K dielectric layer formed over the first high-K dielectric layer. The first high-K dielectric layer has a lower etch rate to an etchant relative to the second high-K dielectric layer. The integrated circuit includes a second device having a gate structure including a gate dielectric including the first high-K dielectric layer formed over the substrate.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
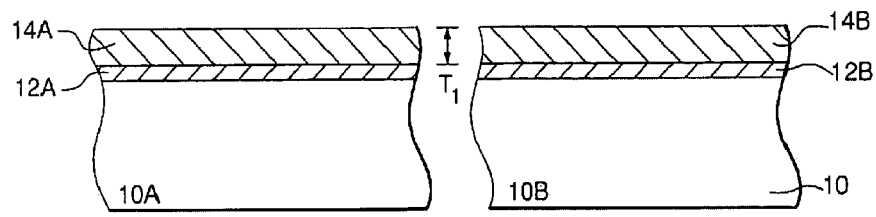
FIGS. 1–3 are cross-sectional views of portion of a semiconductor substrate illustrating the formation of a dual-gate structure thereon.

FIG. 1 is a cross-sectional view of portions of a semiconductor device substrate 10. The semiconductor substrate 10 may be a monocrystalline semiconductor silicon wafer, a semiconductor-on-insulator wafer, or any other substrate used in forming semiconductor wafers. The semiconductor wafer 10 includes at least a first and second areas, designated generally as 10A and 10B, defined for a first and second MOSFET gate structures. In one embodiment, an interfacial layer 12A, 12B is formed over the areas 10A and 10B such as by growth or chemical reaction. Examples of interfacial layers include SiO, SiON or SiN. Interfacial layer 12 is generally used to avoid drive current degradation sometimes associated with formation of a high-K dielectric layer directly on a silicon substrate. In an alternative embodiment (not shown), no interfacial layer is formed between the gate dielectric and the substrate. Prior to forming the interfacial layer 12, the substrate surface is preferably cleaned, using any suitable hydrophilic or hydrophobic cleaning process, for example.

After interfacial layer formation, a first high-K dielectric layer 14A, 14B is formed in the first and second areas 10A, 10B over the interfacial layer 12. Examples of suitable high-K materials include tantalum oxide ($Ta_2O_5$), titanium oxide ($TiO_2$), aluminum oxide ($Al_2O_3$), zirconium oxide ($ZrO_2$), hafnium oxide ($HfO_2$), yttrium oxide ($Y_2O_3$) and lanthanum oxide ($La_2O_5$), and their aluminates and silicates. Formation processes may include atomic layer chemical vapor deposition (ALCVD), metal organic CVD (MOCVD) or sputtering. The target physical thickness $T_1$ for the first high-K dielectric layer should be approximately that of the desired dielectric thickness of the thinner gate dielectric of the dual-gate structure, and preferably, but not necessarily, has a thickness in the range of 1.5–5.0 nm.

Figure 2:
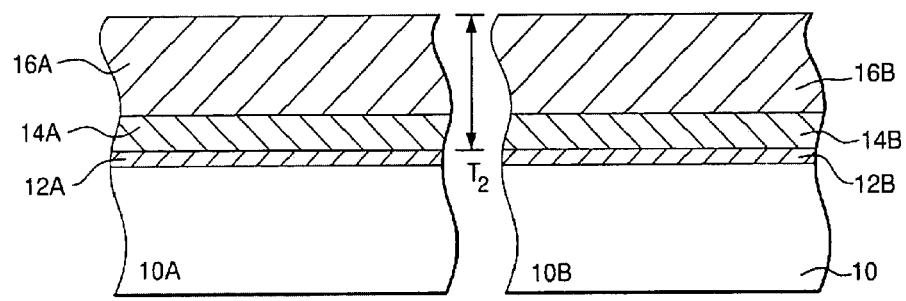

Referring to FIG. 2, a second high-K dielectric layer 16 (16A, 16B) is shown formed over the first high-K dielectric layer 14. The physical thickness $T_2$ for the combined dielectric structure including the first high-K dielectric layer 14 and second high-K dielectric layer 16 should be that of the target physical thickness for the thicker gate dielectric of the dual-gate structure. The second high-K dielectric layer 16 preferably, but not necessarily, has a thickness of less than 10 nm.

In an exemplary method of forming a dual-gate structure and integrated circuit device having a dual-gate structure, the first high-K dielectric layer 14 has a lower etch rate to an etchant relative to the etch rate to the same etchant of the second high-K dielectric layer 16. Put another way, in the presence of the same etchant solution or environment, the second high-K layer 16 etches faster than the first high-K layer 14. This can be accomplished through material selection and/or by processing the first high-K dielectric layer 14 to have a lower etch rate. The first high-K layer 14 may be, for example, a metal oxide and the second high-K layer 16 may be a metal silicate, which has a higher etch rate than the metal oxide to the selected etchant.

As mentioned, in lieu of or in addition to material selection, the first high-K dielectric layer 14 may be processed to reduce its etch rate to an etchant before formation of the second high-K dielectric layer 16 thereover. One exemplary processing method for high-K materials that has been shown to reduce the etch rate of the high-K material is a thermal anneal step. It is believed that the anneal step increases the density of the annealed layer, but the applicants do not wish to be limited by any particular theory. This is a particularly effective method when it is desired to use the same material for both the first and second high-K layers. After formation of the first high-K dielectric layer 14 in FIG. 1 and before the formation of the second high-K dielectric layer 16 thereover, as shown, in FIG. 2, the first high-K dielectric layer is annealed in a $N_2$, $NH_3$, $O_2$, NO or $N_2O$ environment at, for example, 500° C. to 1000° C. for between 30 seconds to 1 hour. According to J. Chambers, ECS Sep., Effect of Composition and Post-Deposition Annealing on the Etch Rate of Hafnium and Zirconium Silicates in Dilute HF, the etch rate of a dielectric materials decreases as the silicon content of the dielectric materials decreases and anneal steps are added. This is indicated by the following chart showing the etch rate of various dielectrics in a dilute HF solution.

|  | Thermal Oxide (non-high-K) material | PVD $HfO_2$ | PVD $HfO_2$ | PVD Hf-Silicate (50:50) | PVD Hf-Silicate (50:50) |
| --- | --- | --- | --- | --- | --- |
| Thermal treatment | No anneal step | No anneal step | 1000° C. for 30 minutes ($N_2$ anneal) | No anneal step | 1000° C. for 30 minutes ($N_2$ anneal) |
| Etch Rate | 23 Å/min | 33 Å/min | <0.1 Å/min | 85 Å/min | 2 Å/min |

The above chart shows, inter alia, that for a physical vapor deposited (PVD) hafnium oxide layer, the etch rate decreases from 33 Å/min to less than 0.1 Å/min after a 30 minute nitrogen anneal process at 1000° C. Similar results are seen with hafnium silicate. Although the etch rate of the annealed Hafnium silicate is higher than that of annealed hafnium oxide, it is still significantly lower than non-processed Hafnium Silicate.

Similar results were also reported for Hafnium Oxide deposited on a substrate by atomic layer chemical vapor deposition (ALCVD) and etched using $H_2SO_4$ at 150° C. for 30 minutes, both in and out of the presence of HF, as reported by the semiconductor research consortium International SEMATECH (ISMT).

| Dielectric Layer | HF present? | Initial Thick. | Final Thick. | Delta Thick. | Etch Rate (Å/min) |
| --- | --- | --- | --- | --- | --- |
| ALCVD $HfO_2$ (no-anneal step) | No | 218.9 | 34.1 | −184.8 | 6.2 |
| ALCVD $HfO_2$ (no-anneal step) | 500 ppm | 240.7 | 26.5 | −214.2 | 7.1 |
| ALCVD $HfO_2$ (anneal - 120 min. @ 560° C.) | No | 219.8 | 215.3 | −4.5 | 0.2 |
| ALCVD $HfO_2$ (anneal - 120 min. @ 560° C.) | 500 ppm | 220.4 | 216.2 | −4.2 | 0.1 |
| Thermal Oxide | No | 3037.9 | 3035.0 | −2.9 | 0.1 |
| Thermal Oxide | 500 ppm | 3061.9 | 2964.9 | −97.0 | 3.2 |

As can be seen from the table, the etch rate of the hafnium oxide dielectric layer decreases significantly with the addition of the anneal step.

Figure 3:
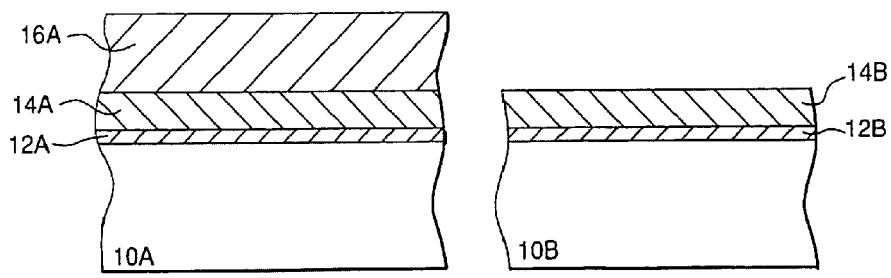

Referring to FIG. 3, a resist layer (not shown) is then patterned to expose portions of the second high-K dielectric layer in area 10B defined for the thinner gate structure, and the second high-K dielectric layer 16 is then etched from second area 10B in order to form the gate dielectric of the thin gate structure of the dual gate structure. The second high-K dielectric layer 16 is preferably etched completely from the area 10B utilizing the first dielectric layer 14B, which has a lower etch rate to the selected etchant compared with the second high K dielectric layer 16B (due to material selection and/or processing), as an etch stop layer. The etch process may be, for example, a wet-chemical etch using HF, $H_2SO_4$, $H_3PO_4$ or $HNO_3$, or any other etch process appropriate for high-K materials.

In one embodiment of the present method, the second high-K dielectric layer 16A and 14B are optionally annealed after the aforementioned etch process, which removes second high-K dielectric layer 16B from area 10B. This post-annealing step could further improve the film quality of the second high-K dielectric layer 16A and also remove some etching damage on the first high-K layer 14B.

Figure 4:
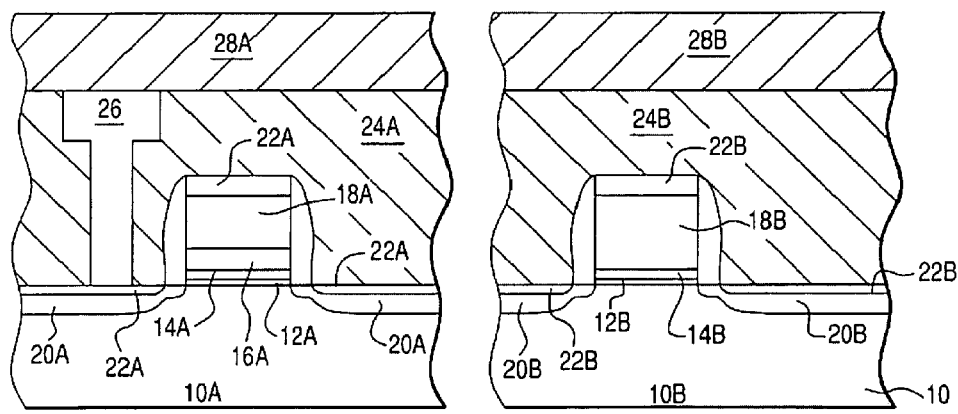
FIG. 4 is an illustration of an integrated circuit device having a plurality of devices including a dual-gate structure.

After forming the gate dielectric layers of the first and second gate structures in areas 10A and 10B, processing can continue to form the devices of the integrated circuit that include the aforementioned gate dielectric structures, i.e., combined dielectric layers 14A and 16A for the first device and dielectric later 14B for the second device. Typical post-gate dielectric formation processing steps are set forth in U.S. Pat. No. 6,261,978 to Chen et al, the entirety of which is hereby incorporated herein by reference, but are briefly outlined hereafter in connection with FIG. 4.

Gate electrodes 18A, 18B and source/drain regions 20A, 20B are formed. In one embodiment, a conductive material, such as poly-silicon or silicon germanium, is formed over the first and second gate dielectric structures 10A and 10B. The conductive material is patterned and etched to form gate electrodes. Appropriate masking layers and implants are used to dope the gates and their respective source/drain regions. N-type dopants are used in P-well regions to form n-channel transistors, and p-type dopants are used in N-well regions to form p-channel transistors.

In one exemplary processing method, silicide regions 22A, 22B are formed over exposed surfaces of the source/drain regions 20 and the gate electrodes 18 of the devices after forming doped source/drain regions and doping the gate electrodes. The silicide material can include refractory metals such as titanium, cobalt, molybdenum, or the like. Silicide formation may be accomplished by a self aligning process.

Following the formation of the transistors, an interleval dielectric (ILD) layer 24 (24A, 24B) and interconnects 26 are generally formed. The ILD layer typically includes one or more films that include an oxide, a nitride, a low dielectric constant (low-K) material or the like. The interconnects 26 generally include two portions. The via portions are relatively narrow and make contact to the silicide regions 22. It should be noted that for illustrative purposes only one interconnect 26 is shown, but other interconnects can certainly be formed to connect to other silicide regions 22. The trench portions are wider and allow connections to be made between via portions. Trenches, therefore, primarily form horizontal connections within ILD layers, whereas vias primarily form vertical connections between overlying conductive layers. The interconnects can include conductive materials such as aluminum, copper, or the like. Dopants or alloying elements can be added to the interconnects to improve electromigration resistance or other electrical or reliability properties. Typically, adhesion/barrier layers are formed within the interconnect opening before forming the conductive material within the interconnect opening.

Following the formation of the interconnects 26, a passivation layer 28A, 28B is formed over the semiconductor device. In addition, other ILD layers and interconnect levels can be formed as needed to forma a substantially completed integrated circuit device and ultimately an integrated circuit chip.

As mentioned above, annealing the first high-K dielectric layer 14 after formation thereof lowers the etch rate of the layer such that the first high-K dielectric layer 14 can be used as an etch stop layer, particularly when it is desired to use the same high-K dielectric material for layer 14 and layer 16. The annealing step also provides the benefit of improving the quality of the thicker high-K dielectric structure—the combined first high-K dielectric layer 14A and second high-K dielectric layer 16A of the device of area 10A. This phenomena has been illustrated through experiments on Hafnium Oxide/Poly-Si capacitors, wherein a double high-K dielectric layer deposition process with an intermediate anneal step resulted in suppression of leakage density of the formed capacitor device, as again reported by the semiconductor research consortium International SEMATECH (ISMT).

Further, by utilizing the etch selectivity of the high-K dielectric layers in the method described above, the method avoids the need to re-clean the substrate and re-form the interfacial layer 12 during the dual-gate formation process, as may be expected from a more conventional dual-gate formation process, such as that described in Chen. Further, the anneal process may be accomplished in-situ by using cluster high-K deposition tools, such as are available from ASM International under the trademark POLYGON. The method thereby provides a cleaner and more robust approach to forming dual-gate structures and specifically dual-gate structures having different dielectric thicknesses.

In one embodiment of the present method and dual-gate structure, at least one of the dielectric layers 14, 16 is not a high-K dielectric layer, as long as the first dielectric layer 14 has a lower etch rate to an etchant relative to the second dielectric layer 16. For example, the first dielectric layer 14 may be a high-K dielectric layer and the second layer 16 may be, for example, $SiO_2$, SiON or SiN.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of fabricating a dual-gate structure on a substrate, comprising the following steps:
    forming a first high-K dielectric layer in a first area defined for a first gate structure and in a second area defined for a second gate structure;
    forming a second high-K dielectric layer in said first and second areas, said first high-K dielectric layer having a lower etch rate to an etchant relative to said second high-K dielectric layer;
    etching said second high-K dielectric layer from said second area to said first high-K dielectric layer with said etchant; and
    forming a gate conductive layer in said first and second areas over said second high-K dielectric layer and first high-K dielectric layer, respectively, wherein said first and second high-K dielectric layers comprise a first high-K dielectric material.

2. The method of claim 1,
    wherein said first high-K dielectric layer is deposited to have a thickness approximately equal to a target thickness for a gate dielectric for said second gate structure, and
    wherein said second high-K dielectric layer is deposited to have a thickness approximately equal to a target thickness for a gate dielectric for said first gate structure minus said target thickness for said gate dielectric for said second gate structure.

3. The method of claim 1, wherein said first and second high-K dielectric layers are selected from the group consisting of an oxide, aluminate and silicate of tantalum, titanium, aluminum, zirconium, hafnium, yttrium and lanthanum.

4. The method of claim 1, wherein said etching step includes a wet etch processing using HF, $H_2SO_4$, $H_3PO_4$ or $HNO_3$.

5. The method of claim 1, further comprising the step of processing said first high-K dielectric layer to lower said etch rate of said first high-K dielectric layer.

6. The method of claim 5, wherein said processing step includes the step of annealing said first high-K dielectric layer before forming said second high-K dielectric layer, whereby said etch rate of said first high-K dielectric layer is lowered.

7. The method of claim 6, wherein said annealing step occurs in-situ with said first and second dielectric layer forming steps.

8. The method of claim 6, wherein an anneal temperature of said anneal step is at between about 500 and 1000° C.

9. The method of claim 8, wherein said annealing occurs in a nitrogen, ammonia, oxygen, nitric oxide or nitrous oxide ambience.

10. A method of manufacturing an integrated circuit device, comprising the following steps:
- forming a first high-K dielectric layer in a first area defined for a first gate structure of a first device and in a second area defined for a second gate structure of a second device;
- processing said first high-K dielectric layer to lower an etch rate to an etchant of said first high-K dielectric layer;
- forming a second high-K dielectric layer in said first and second areas over said first high-K dielectric layer, said first high-K dielectric layer having a lower etch rate to said etchant relative to said second high-K dielectric layer;
- etching said second high-K dielectric layer from said second area to said first high-K dielectric layer.

11. The method of claim 10, further comprising the step of forming an interfacial layer between said substrate and said first high-K layer in said first and second areas.

12. The method of claim 10, wherein said first and second high-K dielectric layers are formed from different materials.

13. The method of claim 10, wherein said processing step includes the step of annealing said first high-K dielectric layer before forming said second high-K dielectric layer, whereby said etch rate of said first high-K dielectric layer is lowered.

14. The method of claim 13, wherein said first and second high-K dielectric layer comprise a first high-K dielectric material.

15. The method of claim 13, wherein an anneal temperature of said anneal step is at between about 500 and 1000° C., and said annealing occurs in situ with said forming steps in a nitrogen, ammonia, oxygen, nitric oxide or nitrous oxide ambience.

16. The method of claim 10, wherein said first and second high-K dielectric layers are selected from the group consisting of an oxide, aluminate and silicate of tantalum, titanium, aluminum, zirconium, hafnium, yttrium and lanthanum.

17. The method of claim 16, wherein said etching step includes a wet etch processing using HF, $H_2SO_4$, $H_3PO_4$ or $HNO_3$.

18. A method of fabricating a dual-gate structure on a substrate, comprising the following steps:
- forming a first dielectric layer in a first area defined for a first gate structure and in a second area defined for a second gate structure;
- forming a second dielectric layer in said first and second areas, said first dielectric layer having a lower etch rate to an etchant relative to said second dielectric layer;
- etching said second dielectric layer from said second area to said first dielectric layer wit said etchant; and
- forming a gate conductive layer in said first and second areas over said second dielectric layer and first dielectric layer, respectively,
- wherein said first dielectric layer is a high-K dielectric layer and said second dielectric layer is a non high-K dielectric layer, and
- wherein said first and second areas comprise channel areas having the same conductivity.

19. A method of fabricating a dual-gate structure on a substrate, comprising the following steps:
- forming a first high-K dielectric layer in a first area defined for a first gate structure and in a second area defined for a second gate structure;
- forming a second high-K dielectric layer in said first and second areas, said first high-K dielectric layer having a lower etch rate to an etchant relative to said second high-K dielectric layer;
- forming an interfacial layer between said substrate and said first high-K dielectric layer in said first and second areas;
- etching said second high-K dielectric layer from said second area to said first high-K dielectric layer with said etchant; and
- forming a gate conductive layer in said first and second areas over said second high-K dielectric layer and first high-K dielectric layer, respectively.

20. The method of claim 19,
- wherein said first high-K dielectric layer is deposited to have a thickness approximately equal to a target thickness for a gate dielectric for said second gate structure, and
- wherein said second high-K dielectric layer is deposited to have a thickness approximately equal to a target thickness for a gate dielectric for said first gate structure minus said target thickness for said gate dielectric for said second gate structure.

21. The method of claim 19, wherein said first and second high-K dielectric layers are formed from different materials.

22. The method of claim 19, further comprising the step of annealing a remaining portion of said second high-K dielectric layer and said first high-K dielectric layer alter said etching step.

23. The method of claim 19, wherein said first and second high-K dielectric layers are selected from the group consisting of an oxide, aluminate and silicate of tantalum, titanium, aluminum, zirconium, hafnium, yttrium and lanthanum.

24. The method of claim 19, wherein said etching step includes a wet etch processing using HF, $H_2SO_4$, $H_3PO_4$ or $HNO_3$.

25. The method of claim 19, further comprising the step of annealing said first high-K dielectric layer before forming said second high-K dielectric layer, whereby said etch rate of said first high-K dielectric layer is lowered.

26. The method of claim 25, wherein said first and second high-K dielectric layers comprise a first high-K dielectric material.

27. The method of claim 25, wherein said annealing step occurs in-situ with said first and second high-K dielectric forming steps.

28. The method of claim 25, wherein an anneal temperature of said anneal step is at between about 500 and 1000° C.

29. The method of claim 28, wherein said annealing occurs in a nitrogen, ammonia, oxygen, nitric oxide or nitrous oxide ambience.

30. A method of fabricating a dual-gate structure on a substrate, comprising the following steps:
- forming a first high-K dielectric layer in a first area defined for a first gate structure and in a second area defined for a second gate structure;
- forming a second high-K dielectric layer in said first and second areas, said first high-K dielectric layer having a lower etch rate to an etchant relative to said second high-K dielectric layer;
- etching said second high-K dielectric layer from said second area to said first high-K dielectric layer with said etchant;

annealing a remaining portion of said second high-K dielectric layer and said first high-K dielectric layer after said etching step; and forming a gate conductive layer in said first and second areas over said second high-K dielectric layer and first high-K dielectric layer, respectively.

31. The method of claim 30, wherein said first high-K dielectric layer is deposited to have a thickness approximately equal to a target thickness for a gate dielectric for said second gate structure, and wherein said second high-K dielectric layer is deposited to have a thickness approximately equal to a target thickness for a gate dielectric for said first gate structure minus said target thickness for said gate dielectric for said second gate structure.

32. The method of claim 30, wherein said etching step includes a wet etch processing using HF, $H_2SO_4$, $H_3PO_4$ or $HNO_3$.

33. The method of claim 30, wherein said first and second high-K dielectric layers are selected from the group consisting of an oxide, aluminate and silicate of tantalum, titanium, aluminum, zirconium, hafnium, yttrium and lanthanum.

34. The method of claim 30, further comprising the step of annealing said first high-K dielectric layer before fanning said second high-K dielectric layer, whereby said etch rate of said first high-K dielectric layer is lowered.

35. The method of claim 34, wherein said first and second high-K dielectric layers comprise a first high-K dielectric material.

* * * * *

UNITED STATES PATENT AND TRADEMARK OFFICE
CERTIFICATE OF CORRECTION

PATENT NO. : 7,030,024 B2 Page 1 of 1
APPLICATION NO. : 10/226617
DATED : April 18, 2006
INVENTOR(S) : Tuo-Hung Ho et al.

It is certified that error appears in the above-identified patent and that said Letters Patent is hereby corrected as shown below:

Column 7, line 53, delete "wit" and insert therefor --with--;

Column 8, line 29, delete "alter" and insert therefor --after--; and

Column 10, line 10, delete "fanning" and insert therefor --forming--.

Signed and Sealed this

Seventeenth Day of April, 2007

JON W. DUDAS
*Director of the United States Patent and Trademark Office*